(12) United States Patent
Camacho et al.

(10) Patent No.: US 8,604,596 B2
(45) Date of Patent: Dec. 10, 2013

(54) INTEGRATED CIRCUIT PACKAGING SYSTEM WITH LOCKING INTERCONNECTS AND METHOD OF MANUFACTURE THEREOF

(75) Inventors: Zigmund Ramirez Camacho, Singapore (SG); Emmanuel Espiritu, Singapore (SG); Henry Descalzo Bathan, Singapore (SG)

(73) Assignee: Stats Chippac Ltd., Singapore (SG)

( * ) Notice: Subject to any disclaimer, the term of this patent is extended or adjusted under 35 U.S.C. 154(b) by 146 days.

(21) Appl. No.: 13/071,433

(22) Filed: Mar. 24, 2011

(65) Prior Publication Data
US 2012/0241947 A1    Sep. 27, 2012

(51) Int. Cl.
*H01L 23/495* (2006.01)

(52) U.S. Cl.
USPC .................................. 257/676; 257/E23.033

(58) Field of Classification Search
USPC .......... 257/E23.033, E23.043, 675–676, 666, 257/788, 667
See application file for complete search history.

(56) References Cited

U.S. PATENT DOCUMENTS

| | | | |
|---|---|---|---|
| 6,498,099 B1 | 12/2002 | McLellan et al. | |
| 6,562,660 B1 * | 5/2003 | Sakamoto et al. | 438/124 |
| 6,946,324 B1 | 9/2005 | McLellan et al. | |
| 7,582,957 B2 | 9/2009 | Tay | |
| 2008/0067639 A1 | 3/2008 | Do et al. | |
| 2008/0067640 A1 | 3/2008 | Do et al. | |
| 2008/0079127 A1 * | 4/2008 | Gerber | 257/676 |
| 2010/0258934 A1 * | 10/2010 | Chang Chien et al. | 257/690 |

* cited by examiner

*Primary Examiner* — Matthew W Such
*Assistant Examiner* — Ali Naraghi
(74) *Attorney, Agent, or Firm* — Ishimaru & Associates LLP; I-Chang John Yang

(57) ABSTRACT

A method of manufacture of an integrated circuit packaging system includes: providing a lead frame having a hole, a lead extension, and an exterior pad under the lead extension with the hole abutting the lead extension; connecting an electrical interconnect between an integrated circuit and the lead extension; forming an encapsulation over the integrated circuit and surrounding the electrical interconnect and through the hole; and removing a bottom portion of the lead frame resulting in a stand-off lead from the lead extension with the exterior pad on the stand-off lead.

14 Claims, 4 Drawing Sheets

INTEGRATED CIRCUIT PACKAGING SYSTEM WITH LOCKING INTERCONNECTS AND METHOD OF MANUFACTURE THEREOF

TECHNICAL FIELD

The present invention relates generally to an integrated circuit packaging system, and more particularly to a system for encapsulation of integrated circuits.

BACKGROUND ART

The electronic industry continues to seek products that are lighter, faster, smaller, multi-functional, more reliable, and more cost-effective. The advent of multi-function electronic devices, such as cell phones that are also game platforms, cameras, Internet portals, and music or video players, has brought immense pressure on the electronics device manufacturers and the manufacturing companies that support them.

In an effort to meet such requirements, package assembly techniques have been developed for smaller packages. These types of packages can combine two or more semiconductor chips in a single package, thereby realizing increased memory density, multi-functionality, and/or reduced package footprint.

Thus, a need still remains for integrated circuit packaging system for increasing integration, decrease size, and increased reliability. In view of the challenges of balancing all these needs, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a lead frame having a hole, a lead extension, and an exterior pad under the lead extension with the hole abutting the lead extension; connecting an electrical interconnect between an integrated circuit and the lead extension; forming an encapsulation over the integrated circuit and surrounding the electrical interconnect and through the hole; and removing a bottom portion of the lead frame resulting in a stand-off lead from the lead extension with the exterior pad on the stand-off lead.

The present invention provides an integrated circuit packaging system, including: a stand-off lead having a lead protrusion; an exterior pad on and under the stand-off lead; an integrated circuit connected to the stand-off lead; and an encapsulation over the integrated circuit with the encapsulation coplanar to a portion of the exterior pad and not coplanar with other portion of the exterior pad.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
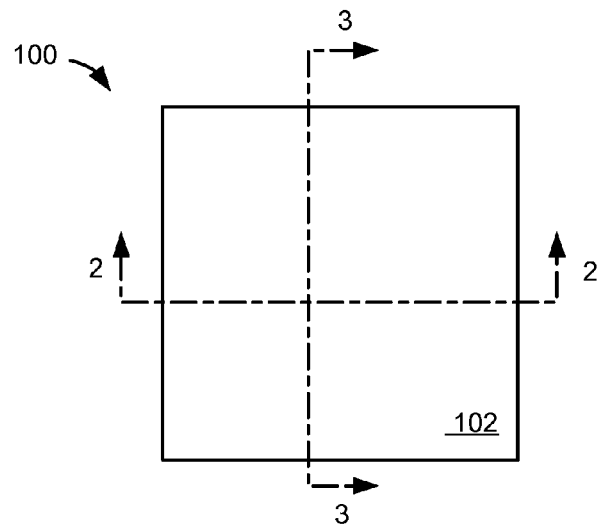
FIG. 1 is a top view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the active side of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact among elements.

The term "processing" as used herein includes deposition of material or photoresist, patterning, exposure, development, etching, cleaning, and/or removal of the material or photoresist as required in forming a described structure.

Referring now to FIG. 1, therein is shown a top view of an integrated circuit packaging system 100 in a first embodiment of the present invention. The top view depicts an encapsulation 102 of the integrated circuit packaging system 100.

The encapsulation 102 is a hermetically sealed cover protecting and insulating the components with the integrated circuit packaging system 100. The encapsulation 102 is formed from a number of different materials. Examples of the encapsulation 102 are epoxy molding compound, resin, or other materials that is electrically nonconductive.

Figure 2:
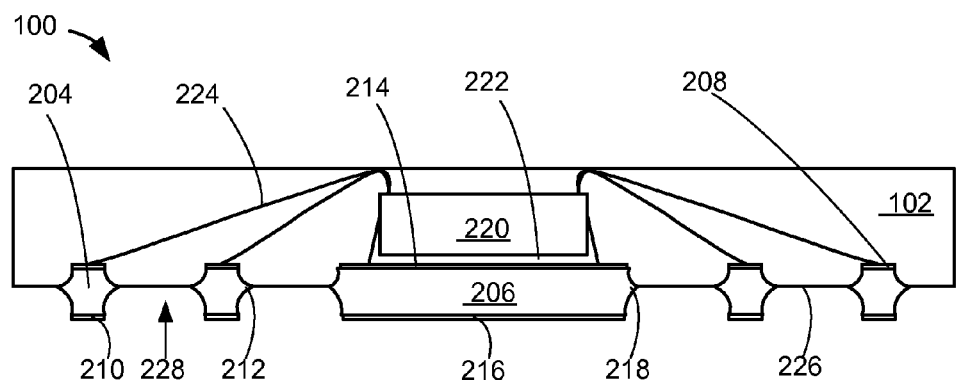
FIG. 2 is a cross-sectional view of the integrated circuit packaging system along line 2-2 of FIG. 1.

Referring now to FIG. 2, therein is shown a cross-sectional view of the integrated circuit packaging system 100 along line 2-2 of FIG. 1. The cross-sectional view depicts stand-off leads 204 and a stand-off die paddle 206.

The stand-off leads 204 provide electrical connection between a next level system (not shown), such as a printed circuit board or a packaged integrated circuit. The stand-off leads 204 are also have locking features for molding locking with the encapsulation 102 and the locking features span only partially around the perimeter of the locking feature.

Each of the stand-off leads 204 can include an interior pad 208 and an exterior pad 210. The interior pad 208 provides an electrical connection structure within the integrated circuit packaging system 100. The exterior pad 210 provides an electrical connection structure to the integrated circuit packaging system 100 from the external environment.

Each of the stand-off leads 204 can include a lead protrusion 212 along the non-horizontal side of the stand-off leads 204. The lead protrusion 212 provides the locking feature for the stand-off leads 204. For example, the lead protrusion 212 is shown the as the merging of two concave portions of the non-horizontal side with one concave portion from the interior pad 208 and the other from the exterior pad 210.

The stand-off die paddle 206 provide a mounting structure for circuits within the integrated circuit packaging system 100 and also serve as a heat sink. The stand-off die paddle 206 are also have locking features for molding locking with the encapsulation 102 and the locking features span only partially around the perimeter of the locking feature. The stand-off die paddle 206 can be surrounded by the stand-off leads 204.

The stand-off die paddle 206 can include an interior paddle pad 214 and an exterior paddle pad 216. The interior paddle pad 214 is within the interior of the integrated circuit packaging system 100. The exterior paddle pad 216 is exposed outside the integrated circuit packaging system 100.

The stand-off die paddle 206 can include a paddle protrusion 218 along the non-horizontal side of the stand-off die paddle 206. The paddle protrusion 218 provides the locking feature for the stand-off die paddle 206. For example, the paddle protrusion 218 is shown as the merging of two concave portions of the non-horizontal side with one concave portion from the interior paddle pad 214 and the other from the exterior paddle pad 216.

The stand-off leads 204 and the stand-off die paddle 206 can be coplanar to each other. As a specific example, the both horizontal sides for each of the stand-off leads 204 can be coplanar with the respective horizontal sides of the stand-off die paddle 206. As a more specific example, the interior pad 208 can be coplanar with the interior paddle pad 214 and the exterior pad 210 can be coplanar with the exterior paddle pad 216.

An integrated circuit 220 can be mounted to the stand-off die paddle 206 with an adhesive 222. The integrated circuit 220 is an active device having active circuitry fabricated thereon. Examples of the integrated circuit are an integrated circuit die, a flip chip, or a packaged integrated circuit. The adhesive 222 is a bonding material to attach the elements at opposite sides of the adhesive 222. Examples of the adhesive 222 are die-attach adhesive, an adhesive film, an adhesive tape, or an adhesive paste. As a specific example, the adhesive 222 is on the interior paddle pad 214.

Electrical interconnects 224 can attach the integrated circuit 220 and the stand-off leads 204. The electrical interconnects 224 are structures providing electrical conduction between elements at the ends of each of the electrical interconnects 224. Examples of the electrical interconnects 224 are bond wires, ribbon bond wires, planar interconnects, solder balls, solder bumps, or conductive posts. As a specific example, the electrical interconnects 224 connect between the integrated circuit 220 and the interior pad 208.

The encapsulation 102 can cover and surround the integrated circuit 220 and the electrical interconnects 224. The encapsulation 102 can also cover and surround the upper portion of the stand-off leads 204 from the lead protrusion 212. As a specific example, the encapsulation 102 can cover and surround the interior pad 208.

The encapsulation 102 can also cover and surround the upper portion of the stand-off die paddle 206 from the paddle protrusion 218. As a specific example, the encapsulation 102 can cover and surround the interior paddle pad 214.

From this cross-sectional view, the furthest extent of the lead protrusion 212 is shown at a recessed edge 226 of the encapsulation 102, as an example. The furthest extent of the paddle protrusion 218 is also shown at the recessed edge 226 of the encapsulation 102, as an example. The lower concave portions of the non-horizontal sides of the stand-off leads 204 and the stand-off die paddle 206 form a recess 228 with the encapsulation 102. The recessed edge 226 of the encapsulation 102 can be between the lower concave portions of the non-horizontal sides of the stand-off leads 204 adjacent to another or one adjacent to the stand-off die paddle 206.

The recess 228 can provide air flow channels that can be used to cool the stand-off die paddle 206 for dissipating heat from the integrated circuit 220. The recess 228 can also provide physical separation between the stand-off leads 204, and the stand-off leads 204 and the stand-off die paddle 206 to avoid inadvertent shorting when connecting to the next system level.

Figure 3:
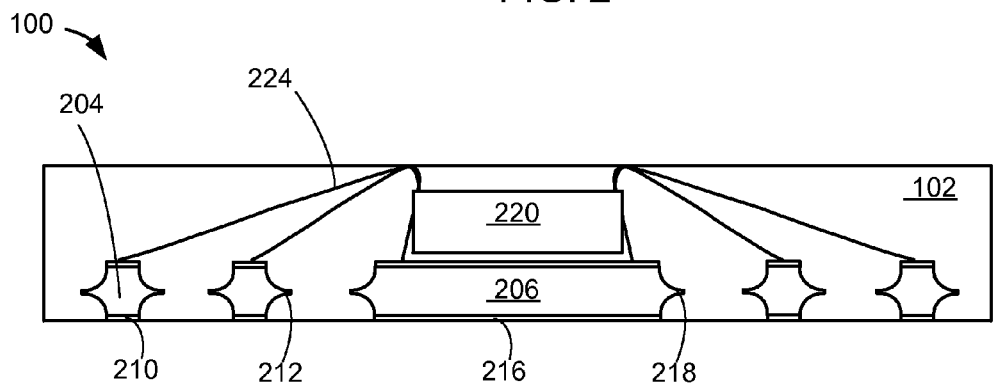
FIG. 3 is a cross-sectional view of the integrated circuit packaging system along line 3-3 of FIG. 1.

Referring now to FIG. 3, therein is shown a cross-sectional view of the integrated circuit packaging system 100 along line 3-3 of FIG. 1. This cross-sectional view depicts a cross-section that is perpendicular to the cross-section shown in FIG. 2.

The cross-sectional view also depicts the stand-off die paddle 206 with the stand-off leads 204 located laterally to the stand-off die paddle 206, as an example. The integrated circuit 220 can be mounted to the stand-off die paddle 206. The electrical interconnects 224 can connect between the integrated circuit 220 and the stand-off leads 204. The encapsulation 102 can cover and surround the integrated circuit 220 and the electrical interconnects 224.

This cross-sectional view depicts the encapsulation 102 can also cover and surround the stand-off leads 204. This depiction is viewed in light of FIG. 2 for a viewing the stand-off leads 204 in the encapsulation 102. As mentioned above, the stand-off leads 204 have the lead protrusion 212 locked into place in the encapsulation 102 but not necessarily around the entire perimeter of the non-horizontal side of the stand-off leads 204, as shown in FIG. 2.

This cross-sectional view depicts the encapsulation 102 completely covering and surrounding the lead protrusion 212 that was not completely covered or surrounded in FIG. 2. The encapsulation 102 can cover the stand-off leads 204 and exposing only the exterior pad 210, as an example. The exterior pad 210 can be coplanar to the bottom side of the encapsulation 102 in this view.

This cross-sectional view depicts the encapsulation 102 can also cover and surround the stand-off die paddle 206. This depiction is viewed in light of FIG. 2 for a viewing the stand-off die paddle 206 in the encapsulation 102. As mentioned above, the stand-off die paddle 206 have the paddle protrusion 218 locked into place in the encapsulation 102 but not necessarily around the entire perimeter of the non-horizontal side of the stand-off die paddle 206, as shown in FIG. 2.

This cross-sectional view depicts the encapsulation 102 completely covering and surrounding the paddle protrusion 218 that was not completely covered or surrounded in FIG. 2. The encapsulation 102 can cover the stand-off die paddle 206 and exposing only the exterior paddle pad 216, as an example. The exterior paddle pad 216 can be coplanar to the bottom side of the encapsulation 102 in this view.

When the cross-sectional views of FIG. 2 and FIG. 3 are considered, the encapsulation 102 coverage around the stand-off leads 204 and the stand-off die paddle 206 can vary depending on the where the encapsulation 102 is located relative to the views between FIG. 2 and FIG. 3. For example, FIG. 2 depicts the encapsulation 102 at the tip of the lead protrusion 212 and the paddle protrusion 218 while FIG. 3 depicts the encapsulation 102 below the lead protrusion 212 and the paddle protrusion 218 and exposing only the exterior pad 210 and the exterior paddle pad 216, as an example.

If the encapsulation 102 is viewed from a viewpoint moving from the cross-sectional line from FIG. 2 to FIG. 3, the bottom of the encapsulation 102 moves from the location shown in FIG. 2 to the location shown in FIG. 3. The bottom of the encapsulation 102 abutting the stand-off leads 204 and the stand-off die paddle 206 can gradually be from that shown in FIG. 2 to that shown in FIG. 3 or can be more abrupt.

It has been discovered that the present invention provides the integrated circuit packaging system 100 with improved reliability. The stand-off leads 204 and the stand-off die paddle 206 locks into the encapsulation 102 with the lead protrusion 212 and the paddle protrusion 218 completely enclose in the encapsulation 102 at some portion of the perimeter of the lead protrusion 212 and the paddle protrusion 218. The portions of the perimeter of both the lead protrusion 212 and the paddle protrusion 218 that are not completely enclosed in the encapsulation 102 or only partly enclosed as shown in FIG. 2 form the recess 228 of FIG. 2 with the encapsulation 102. The recess 228 allows for air flow to help dissipate the heat from the integrated circuit 220. The portion of the lead protrusion 212 and the paddle protrusion 218 that completely enclosed or enclosed more than what is shown in FIG. 2 locks the stand-off leads 204 and the stand-off die paddle 206 to improve pull strength performance for the stand-off leads 204 and the stand-off die paddle 206. Both the ability to dissipate heat while improving pull strength performance results in improved reliability of the integrated circuit packaging system 100.

Figure 4:
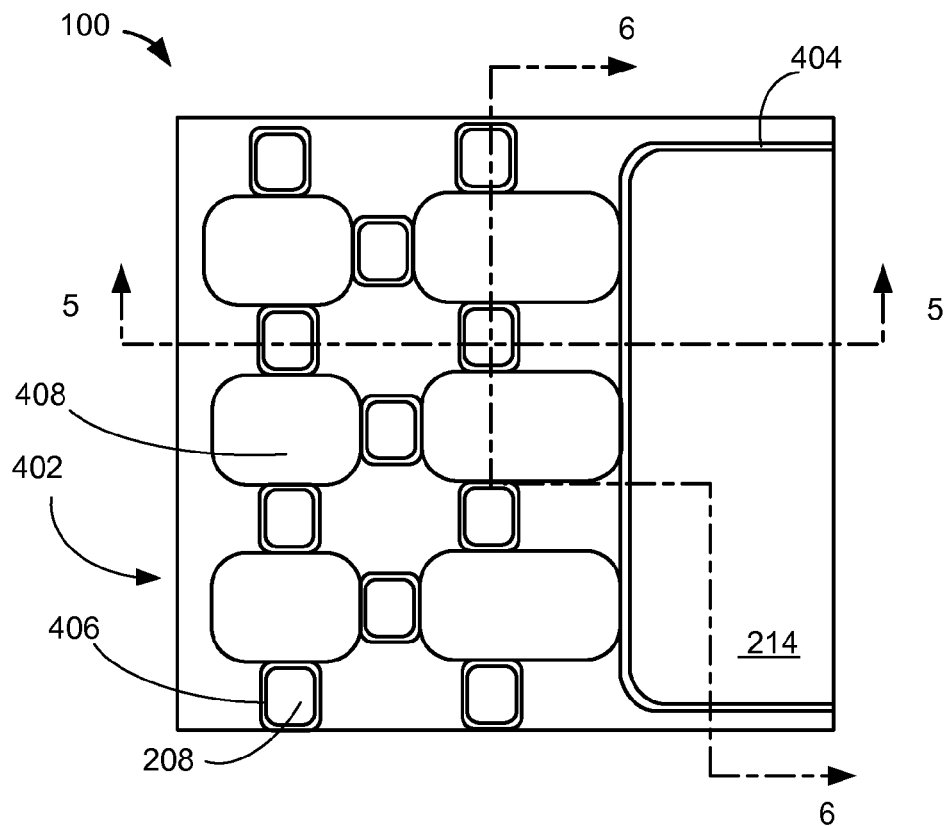
FIG. 4 is a top view of the integrated circuit packaging system in a lead frame step of manufacturing.

Referring now to FIG. 4, therein is shown a top view of the integrated circuit packaging system 100 in a lead frame step of manufacturing. The top view depicts a portion of a lead frame 402 having a paddle extension 404 and lead extensions 406. The top view depicts a portion of the paddle extension 404 and a subset numbers of the lead extensions 406, for example. The paddle extension 404 can include the interior paddle pad 214. The lead extensions 406 can also include the interior pad 208.

The lead frame 402 can also include holes 408 separating alternating rows and alternative columns of the lead extensions 406. The top view depicts, for example, a subset number of the holes 408 of the lead frame 402. The holes 408 can extend to the lead extensions 406 and the paddle extension 404 directly adjacent or abutting to each of the holes 408.

As an example, the size of the holes 408 can vary depending upon the distance to the paddle extension 404 or the density or varying density of the lead extensions 406. As a specific example, the holes 408 directly adjacent to or abutting the paddle extension 404 is shown larger than the holes 408 between and abutting to the lead extensions 406.

Figure 5:
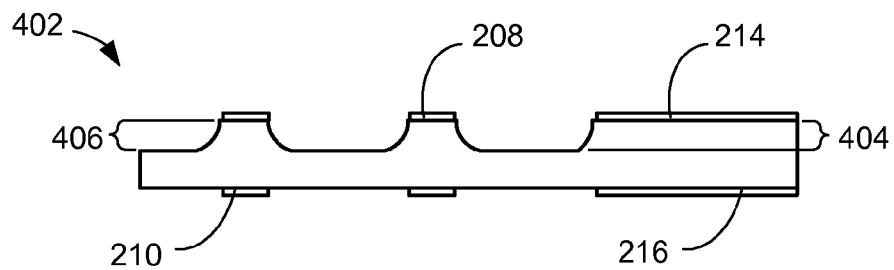
FIG. 5 is a cross-sectional view of the lead frame along line 5-5 of FIG. 4.

Referring now to FIG. 5, therein is shown a cross-sectional view of the lead frame 402 along line 5-5 of FIG. 4. This cross-sectional view depicts the lead frame 402 having the paddle extension 404 and the lead extensions 406. The interior paddle pad 214 can be on the paddle extension 404 and the interior pad 208 can be on the lead extensions 406.

The interior paddle pad 214 and the interior pad 208 can be formed by a number of processes. For example, material of the interior paddle pad 214 and the interior pad 208 can be deposited, plated, and sputtered onto the lead frame 402. The material can be patterned to the interior paddle pad 214 and the interior pad 208. The interior paddle pad 214 and the interior pad 208 can also function as protective patterns for further processing of the lead frame 402 to form the recesses between the paddle extension 404 and the lead extensions 406 and between the lead extensions 406 themselves. The portion of the lead frame 402 that represents the lead extensions and the paddle extension 404 is from the bottom of the recess, which is planar, as an example.

The recesses can be formed from an etching process or a grinding process. An example of the material for the interior paddle pad 214 and the interior pad 208 can be nickel palladium gold alloy (NiPdAu), which is can be resistance to etching.

This cross-sectional view depicts a bottom side of the lead frame 402 as planar. This view also depicts, for example, the exterior pad 210 and the exterior paddle pad 216. As a specific example, the exterior pad 210 and the exterior paddle pad 216 are shown below the interior pad 208 and the interior paddle pad 214, respectively. The exterior pad 210 and the exterior paddle pad 216 can be formed from the same materials and processes as the interior pad 208 and the interior paddle pad 214.

Figure 6:
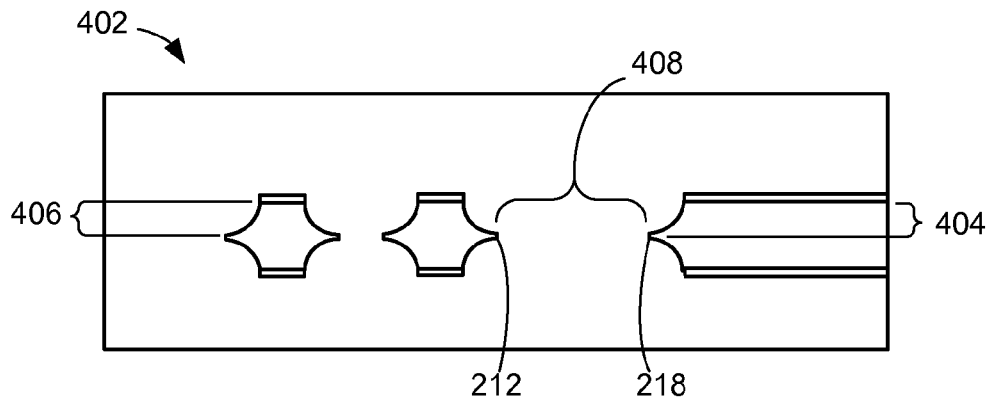
FIG. 6 is a cross-sectional view of the lead frame along line 6-6 of FIG. 4.

Referring now to FIG. 6, therein is shown a cross-sectional view of the lead frame 402 along line 6-6 of FIG. 4. In this cross-sectional view, the lead frame 402 is shown with the holes 408 that appear to separate the lead extensions 406 from each other and the paddle extension 404 from the lead extensions 406.

The lead extensions 406 appear to be in the form of the stand-off leads 204 of FIG. 3 but this cross-sectional view should be viewed in light of the cross-sectional view of FIG. 5. Similarly, the paddle extension 404 appear to be in the form of the stand-off die paddle 206 of FIG. 3 but this cross-sectional view should be viewed in light of the cross-sectional view of FIG. 5, as well. This cross-sectional view depicts a portion of the lead frame 402 that will become the lead protrusion 212 and the paddle protrusion 218.

Figure 7:
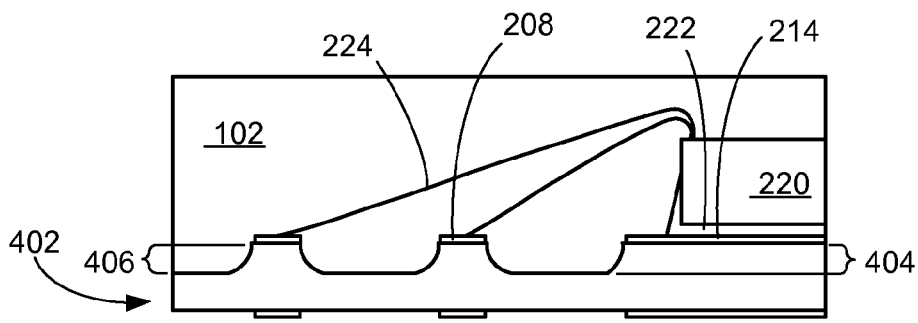
FIG. 7 is the structure of FIG. 5 in an encapsulating phase.

Referring now to FIG. 7, therein is shown the structure of FIG. 5 in an encapsulating phase. The integrated circuit 220 is mounted to the paddle extension 404 with the adhesive 222 on the interior paddle pad 214. The electrical interconnects 224 can connect between the integrated circuit 220 and the interior pad 208 of the lead extensions 406.

The encapsulation 102 can be formed over and on the lead frame 402, as shown in this cross-sectional view, and covering and surrounding the integrated circuit 220 and the electrical interconnects 224. In this view, the encapsulation 102 is shown above the lead frame 402.

Figure 8:
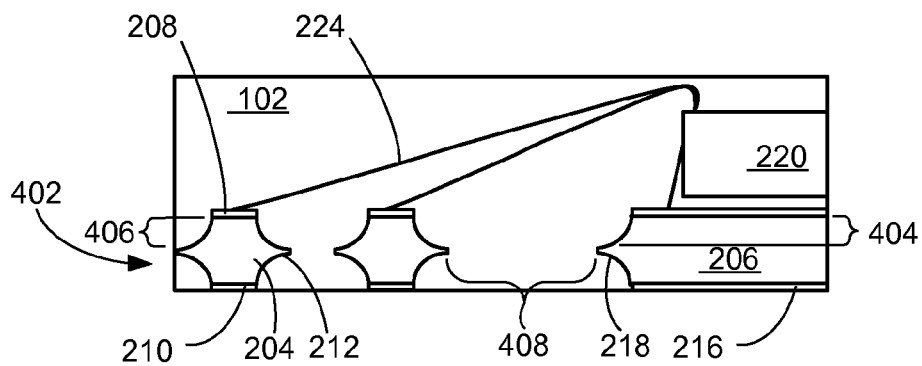
FIG. 8 is the structure of FIG. 6 in the encapsulation phase of FIG. 7.

Referring now to FIG. 8, therein is shown the structure of FIG. 6 in the encapsulation phase of FIG. 7. This cross-sectional view depicts the holes 408 in the lead frame 402. The holes 408 appear to separate the paddle extension 404 and the lead extensions 406 from each other to resemble the stand-off die paddle 206 of FIG. 3 and the stand-off leads 204 of FIG. 3. This cross-sectional view should be viewed in light of FIG. 7.

The integrated circuit 220 mounted to the paddle extension 404. The electrical interconnects 224 can connect between the integrated circuit 220 and the paddle extension 404 or as a more specific example to the interior pad 208.

The encapsulation 102 is shown to be through the holes 408 covering and surrounding the portions of the lead frame 402 that appears to the lead protrusion 212 and the paddle protrusion 218. The bottom side of the encapsulation 102 can be coplanar with and expose the exterior pad 210 and the exterior paddle pad 216.

It has been discovered that the present invention provides the lead frame 402 for providing improved reliability, higher yield, and lower cost. The holes 408 in the lead frame 402 allows the encapsulation 102 to be formed to both coplanar with the exterior pad 210 and the exterior paddle pad 216 as well as being above both. This allows for the encapsulation 102 to lock the stand-off leads 204 and the stand-off die paddle 206 with the protrusions that will form the lead protrusion 212 and the paddle protrusion 218. This single encapsulating step simplifies the manufacturing process as well as simultaneously forms the recess 228 of FIG. 2 for improved heat dissipation while providing mold locking features thereby increasing reliability, increasing yield, and lowering cost.

Also as a specific example, a backside cover tape (not shown) can be sued to control the mold bleeding of the encapsulation 102 onto the exterior pad 210 and the exterior paddle pad 216. Chemical deflash can also be used to remove any mold bleeding or remove adhesive residues left by the cover tape.

Figure 9:
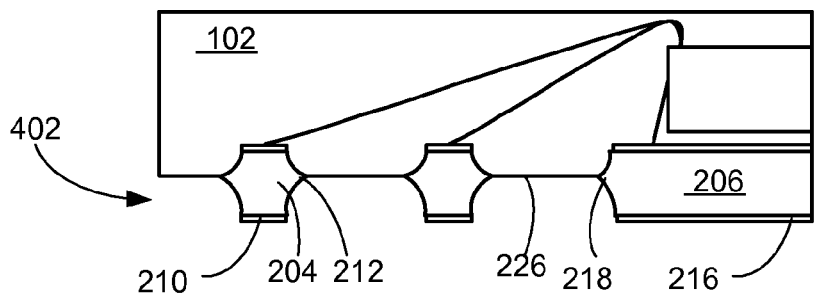
FIG. 9 is the structure of FIG. 7 in a removal phase.

Referring now to FIG. 9, therein is shown the structure of FIG. 7 in a removal phase. The lead frame 402 of FIG. 7 is shown removed. The portion removed is from the bottom of the lead frame 402 and not protected or covered by the exterior pad 210 and the exterior paddle pad 216, which serve as removal mask to protect the portions of the lead frame 402 covered by the exterior pad 210 and the exterior paddle pad 216. The removal process can be performed by a number of processes. For example, the removal can be performed by etching or selective grinding.

The removal phase can result in the formation of the stand-off die paddle 206 and the stand-off leads 204 where the recessed edge 226 of the encapsulation 102 can be at the tip of the paddle protrusion 218 and the lead protrusion 212, as shown in this cross-sectional view. The lower portion of the stand-off leads 204, below the tip of the lead protrusion 212, can be exposed from the encapsulation 102. The lower portion of the stand-off die paddle 206, below the tip of the paddle protrusion 218, can be exposed from the encapsulation 102.

Figure 10:
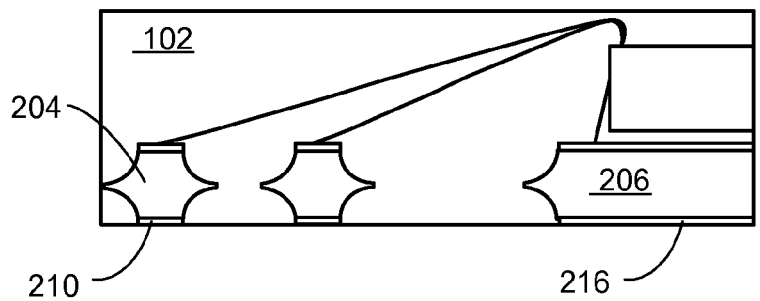
FIG. 10 is the structure of FIG. 8 in the removal phase of FIG. 9.

Referring now to FIG. 10, therein is shown the structure of FIG. 8 in the removal phase of FIG. 9. This cross-sectional view depicts the stand-off leads 204 and the stand-off die paddle 206 enclosed in the encapsulation 102 with the exterior pad 210 and the exterior paddle pad 216 exposed and coplanar with the bottom of the encapsulation 102.

Figure 11:
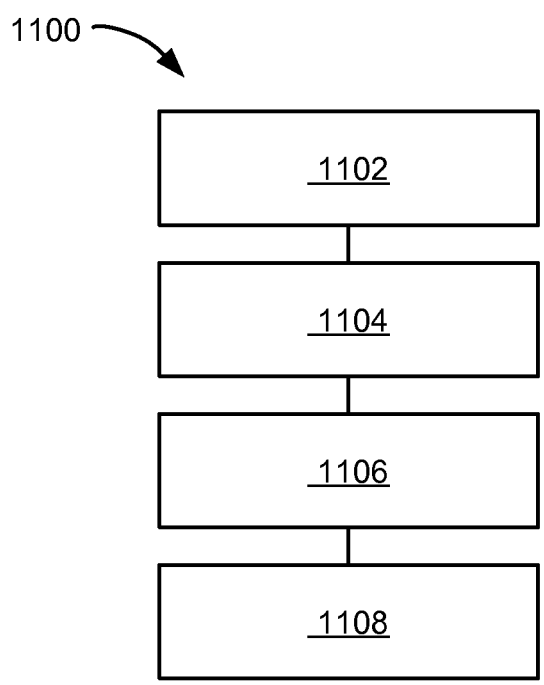
FIG. 11 is a flow chart of a method of manufacture of the integrated circuit packaging system in a further embodiment of the present invention.

Referring now to FIG. 11, therein is shown a flow chart of a method 1100 of manufacture of the integrated circuit packaging system 100 in a further embodiment of the present invention. The method 1100 includes: providing a lead frame having a hole, a lead extension, and an exterior pad under the lead extension with the hole abutting the lead extension in a block 1102; connecting an electrical interconnect between an integrated circuit and the lead extension in a block 1104; forming an encapsulation over the integrated circuit and surrounding the electrical interconnect and through the hole in a block 1106; and removing a bottom portion of the lead frame resulting in a stand-off lead from the lead extension with the exterior pad on the stand-off lead in a block 1108.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:
1. An integrated circuit packaging system comprising:
a stand-off lead having a lead protrusion;
an exterior pad on and under the stand-off lead;
an integrated circuit connected to the stand-off lead; and
an encapsulation over the integrated circuit with the encapsulation coplanar to a portion of the exterior pad and not coplanar with other portion of the exterior pad;
the encapsulation includes a recessed edge; and
the lead protrusion extends to the recessed edge at a portion of the perimeter of the stand-off lead and the encapsulation extends below the lead protrusion at other portion of the perimeter of the stand-off lead.
2. The system as claimed in claim 1 further comprising:
an interior pad on and over the stand-off lead; and
wherein:
the integrated circuit is connected to the interior pad.
3. The system as claimed in claim 2 further comprising an electrical interconnect between the integrated circuit and the interior pad.
4. An integrated circuit packaging system comprising:
a stand-off lead having a lead protrusion;
an exterior pad on and under the stand-off lead;
an integrated circuit connected to the stand-off lead; and an encapsulation over the integrated circuit with the encapsulation coplanar to a portion of the exterior pad and not coplanar with other portion of the exterior pad
a stand-off die paddle, having a paddle protrusion, adjacent to the stand-off lead; and
wherein:
the integrated circuit is mounted to the stand-off die paddle;
the encapsulation includes a recessed edge; and
the paddle protrusion extends to the recessed edge at a portion of a perimeter of the stand-off die paddle and within the encapsulation at other portion of the perimeter portion of the stand-off die paddle.

5. The system as claimed in claim 4,
wherein:
the recessed edge is between the paddle protrusion and the lead protrusion.

6. The system as claimed in claim 4,
wherein:
the encapsulation includes a bottom side below both the paddle protrusion and the lead protrusion.

7. The system as claimed in claim 4, further comprising:
an interior pad on and over the stand-off lead; and
wherein:
the integrated circuit is connected to the interior pad.

8. The system as claimed in claim 7, further comprising:
an electrical interconnect between the integrated circuit and the interior pad.

9. An integrated circuit packaging system comprising:
a stand-off lead having a lead protrusion;
an exterior pad on and under the stand-off lead;
an integrated circuit connected to the stand-off lead; and
an encapsulation over the integrated circuit with the encapsulation coplanar to a portion of the exterior pad and not coplanar with other portion of the exterior pad;
a stand-off die paddle, having a paddle protrusion, adjacent to the stand-off lead;
an exterior paddle pad is on and under the stand-off die paddle; and
wherein:
the encapsulation is coplanar with the exterior paddle pad at a portion of the perimeter of the stand-off die paddle and not coplanar with the exterior paddle pad at other portion of the perimeter of the stand-off die paddle.

10. The system as claimed in claim 9
wherein:
the exterior pad is coplanar with the exterior paddle pad.

11. The system as claimed in claim 9, further comprising:
an interior pad on and over the stand-off lead; and
wherein:
the integrated circuit is connected to the interior pad.

12. The system as claimed in claim 11, further comprising:
an electrical interconnect between the integrated circuit and the interior pad.

13. The system as claimed in claim 9, wherein:
the recessed edge is between the paddle protrusion and the lead protrusion.

14. The system as claimed in claim 9, wherein:
the encapsulation includes a bottom side below both the paddle protrusion and the lead protrusion.

* * * * *